United States Patent
Rahim et al.

(10) Patent No.: US 12,082,377 B2
(45) Date of Patent: Sep. 3, 2024

(54) PASSIVE THERMAL-CONTROL STRUCTURE FOR SPEAKERS AND ASSOCIATED APPARATUSES AND METHODS

(71) Applicant: Google LLC, Mountain View, CA (US)

(72) Inventors: Emil Rahim, San Jose, CA (US); Ihab A. Ali, Cupertino, CA (US); Phanindraja Ancha, San Francisco, CA (US); Neha Ravi Dixit, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 470 days.

(21) Appl. No.: 17/407,789

(22) Filed: Aug. 20, 2021

(65) Prior Publication Data

US 2021/0410334 A1     Dec. 30, 2021

Related U.S. Application Data

(63) Continuation of application No. 16/915,626, filed on Jun. 29, 2020, now Pat. No. 11,212,940.

(51) Int. Cl.
*H04R 1/02*     (2006.01)
*H05K 7/20*     (2006.01)

(52) U.S. Cl.
CPC ......... *H05K 7/20418* (2013.01); *H04R 1/025* (2013.01); *H05K 7/20481* (2013.01);
(Continued)

(58) Field of Classification Search
CPC .......... H05K 7/20418; H05K 7/20481; H05K 7/205; H05K 7/20509; H05K 7/20409; H04R 1/025
(Continued)

(56) References Cited

U.S. PATENT DOCUMENTS 8,995,695 B2 *   3/2015   Ohashi ................ H04R 1/403
                                                              381/386
10,595,105 B2   3/2020   Amae
(Continued)

FOREIGN PATENT DOCUMENTS

WO    2016045120    3/2016
WO    2018125632    7/2018
WO    2021072096    4/2021

OTHER PUBLICATIONS

"Extended European Search Report", EP Application No. 20200820.7, Mar. 5, 2021, 10 pages.
(Continued)

*Primary Examiner* — Sean H Nguyen
(74) *Attorney, Agent, or Firm* — Kilpatrick Townsend & Stockton LLP

(57) ABSTRACT

The present document describes a passive thermal-control structure for speakers and associated apparatuses and methods. The architecture of the passive thermal-control structure is such that heat is transferred from electronic subsystems of the electronic speaker device to the passive thermal-control structure, which acts as an internal, structural frame of the electronic speaker device and provides both thermal mitigation and structural stability. The passive thermal-control structure conducts heat from the electronic subsystems to a housing of the electronic speaker device. The housing of the electronic speaker device may dissipate the heat to the ambient environment to prevent thermal runaway of the electronic subsystems, and the internal frame mitigates the temperature of the housing from exceeding ergonomic temperature limits.

17 Claims, 7 Drawing Sheets

(52) U.S. Cl.
CPC ......... *H05K 7/205* (2013.01); *H05K 7/20509* (2013.01); *H05K 7/20409* (2013.01)

(58) Field of Classification Search
USPC ........................................... 381/386
See application file for complete search history.

(56) References Cited

U.S. PATENT DOCUMENTS

| | | |
|---|---|---|
| 10,681,439 B2 | 6/2020 | Kim et al. |
| 10,805,699 B2 | 10/2020 | Ivey |
| 2009/0073654 A1 | 3/2009 | Beam et al. |
| 2010/0177482 A1 | 7/2010 | Spivey |
| 2013/0294638 A1* | 11/2013 | Huseby ................... H04R 1/02 381/394 |
| 2015/0382448 A1 | 12/2015 | Pennathur et al. |
| 2017/0347172 A1 | 11/2017 | Kim et al. |
| 2018/0343772 A1 | 11/2018 | Raghupathy et al. |
| 2019/0021184 A1 | 1/2019 | Williams et al. |
| 2019/0104640 A1 | 4/2019 | Chang et al. |
| 2020/0112792 A1* | 4/2020 | Ramones ................. H04R 9/06 |
| 2021/0111095 A1 | 4/2021 | Ali et al. |

OTHER PUBLICATIONS

"Extended European Search Report", EP Application No. 20201375. 1, Mar. 11, 2021, 6 pages.
"International Search Report and Written Opinion", PCT Application No. PCT/US2020/054810,.
"Non-Final Office Action", U.S. Appl. No. 16/915,626, filed Apr. 23, 2021, 9 pages.
"Notice of Allowance", U.S. Appl. No. 16/915,626, filed Sep. 1, 2021, 11 pages.

* cited by examiner

PASSIVE THERMAL-CONTROL STRUCTURE FOR SPEAKERS AND ASSOCIATED APPARATUSES AND METHODS

CROSS-REFERENCE TO RELATED APPLICATION

This application is a continuation of and claims priority to U.S. patent application Ser. No. 16/915,626, filed Jun. 29, 2020, the entire disclosure of which is hereby incorporated by reference.

BACKGROUND

Electronic speaker devices (e.g., speakers) have evolved to perform a variety of functions. Such functions may be related to voice commands spoken to a virtual assistant that is integrated into the electronic speaker device to retrieve information, manage a home-automation system, play media, and so on.

When a form factor of the electronic speaker device is reduced, heat generated from electronic subsystems of the electronic speaker device can result in thermal runaway conditions that damage the electronic subsystems. To manage the heat generated from the electronic subsystems, a thermal-control system may be used. However, the design and architecture of an efficient and effective thermal-control system that prevents the thermal runaway, while maintaining the reduced form factor, presents multiple challenges.

SUMMARY

The present document describes a passive thermal-control structure for speakers and associated systems and methods. The architecture of the passive thermal-control structure is such that heat is transferred from electronic subsystems of the electronic speaker device to the passive thermal-control structure, which acts as an internal, structural frame of the electronic speaker device and provides both thermal mitigation and structural stability. Examples of such electronic subsystems include one or more printed circuit boards (PCBs) populated with a variety of integrated circuit (IC) components, such as a System-on-Chip (SoC) IC component, power components, light-emitting diodes, and other heat-dissipating components. The passive thermal-control structure conducts heat from the electronic subsystems to a housing of the electronic speaker device. The housing of the electronic speaker device may dissipate the heat to the ambient environment to prevent thermal runaway of the electronic subsystems, and the internal frame mitigates the temperature of the housing from exceeding ergonomic temperature limits.

In some aspects, an electronic speaker device is described. The electronic speaker device includes a housing member, one or more printed circuit boards (PCBs), one or more speaker modules, and a passive thermal-control structure. The PCB(s) is positioned within the housing member and includes one or more heat-dissipating components. The passive thermal-control structure is positioned within the housing and is thermally coupled to the heat-dissipating components. In addition, the passive thermal-control structure includes at least two thermal-structure components thermally coupled together that form a structural frame for the electronic speaker device, conduct heat away from the heat-dissipating components, define a cavity to house the speaker modules, and having different densities relative to one another.

In other aspects, a passive thermal-control structure for an electronic speaker device is described. The passive thermal-control structure includes a first thermal-structure component and a second thermal-structure component. The first thermal-structure component is formed of a first material. The second thermal-structure component is thermally coupled to the first thermal-structure component to form a structural frame for the electronic speaker device. The second thermal-structure component is formed of a second material that is different than the first material. The structural frame is configured to define a cavity to house one or more speaker modules of the electronic speaker device. In addition, the structural frame is configured to be thermally connected to a plurality of heat-dissipating components of the electronic speaker device.

This summary is provided to introduce simplified concepts of a passive thermal-control structure for speakers and associated apparatuses and methods, which is further described below in the Detailed Description. This summary is not intended to identify essential features of the claimed subject matter, nor is it intended for use in determining the scope of the claimed subject matter.

BRIEF DESCRIPTION OF THE DRAWINGS

The details of one or more aspects of a passive thermal-control structure for speakers and associated apparatuses and methods are described in this document with reference to the following drawings. The same numbers are used throughout the drawings to reference like features and components.

DETAILED DESCRIPTION

Figure 1:
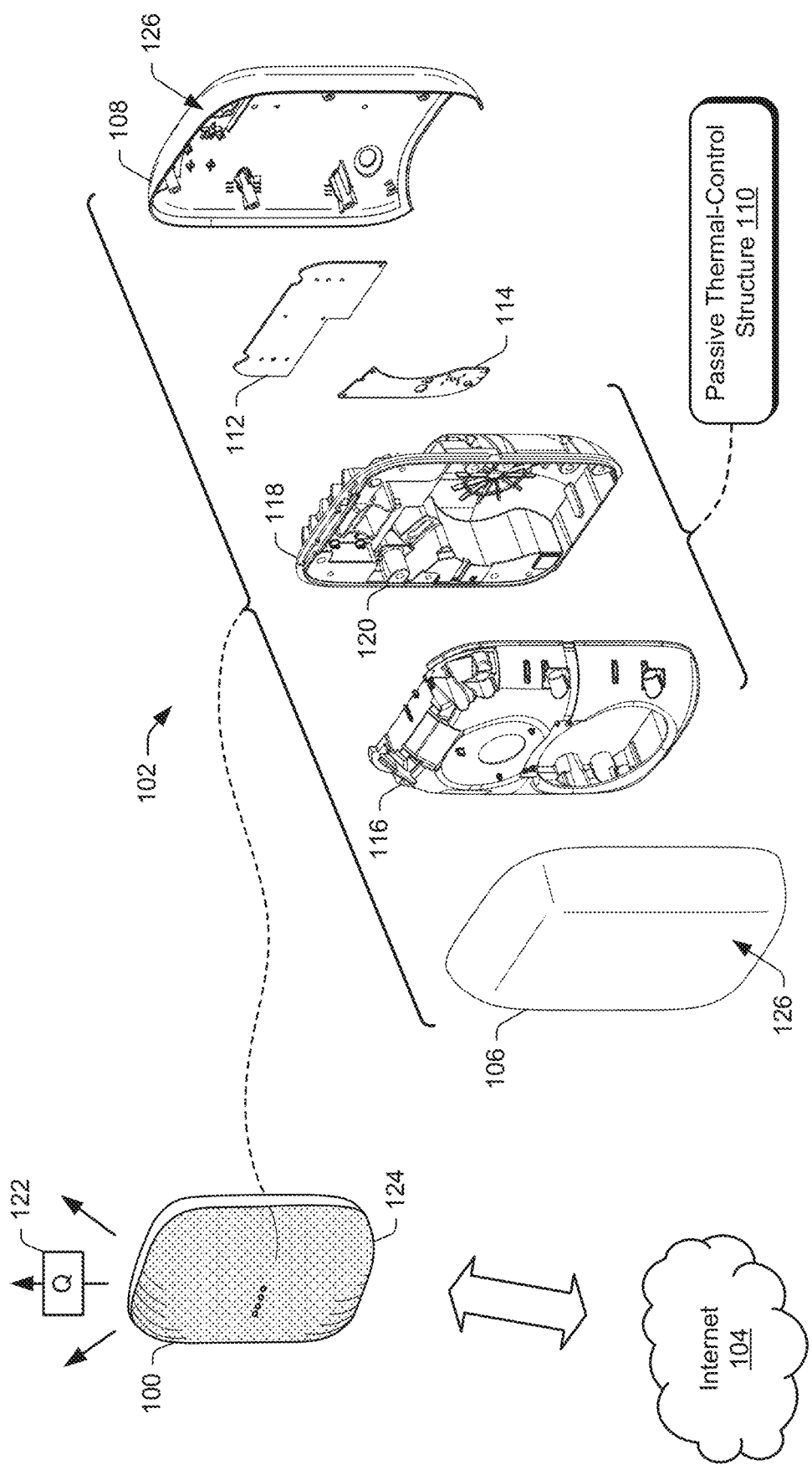
FIG. 1 illustrates an example electronic speaker device and an exploded view of some components thereof.

This document describes a passive thermal-control structure for speakers and associated apparatuses and methods. The architecture of the passive thermal-control structure is such that heat may be transferred from electronic subsystems of the electronic speaker device to an internal frame that provides thermal mitigation and structural stability.

The passive thermal-control structure includes at least two components that are coupled to form a cavity to house one or more speaker modules. The components of the structure together form a frame for the electronic speaker device, and the heat-dissipating components, such as the SoC, power components, etc. are mounted to the frame, for thermal mitigation. The components forming the frame may be different from one another in material, density, thickness, and/or weight. In an example, one of the components may be a diecast magnesium material (e.g., magnesium alloy) and the other component may be a diecast aluminum material (e.g., aluminum alloy). Additionally or alternatively, one component may be thicker and/or heavier than the other component. These differences between the components of the structure provide structural stability when assembled to house the speaker modules in an orientation in which the center of gravity of the speaker modules is offset from center. For instance, some speaker modules have a large, heavy magnet at the back end of the speaker module such that when the speaker module is facing horizontally, the weight of the magnet causes the speaker module to tip over. The passive thermal-control structure balances the weight of the magnet by using a denser, heavier material at the front of the speaker module.

With a form factor that is taller than it is wide (e.g., having a height that is at least double a diameter of its base), the electronic speaker device may have low-structural stability such that it may easily tip over (e.g., has a low tipping angle). The passive thermal-control structure increases the structural stability of the electronic speaker device by centering and lowering the overall center of gravity of the electronic speaker device, which increases the tipping angle.

The different components of the passive thermal-control structure are formed from materials selected to provide appropriate thermal performance that helps sustain the output power or maximize the performance in severe ambient conditions up to 35° C. without requiring degradation or throttling of the performance. The passive thermal-control structure helps to maintain certain thermal conditions, including (i) that the junction temperature of the SoC IC component does not exceed a specification limit (e.g., 80° C.) and (ii) that the temperature (referred to herein as the "skin temperature") of the exterior surface of the electronic speaker device does not exceed an ergonomic limit (e.g., 55° C.).

While features and concepts of the described passive thermal-control system can be implemented in any number of different environments, aspects are described in the context of the following examples.

FIG. 1 illustrates an example electronic speaker device 100 and an exploded view 102 of some components thereof. The electronic speaker device 100, in some aspects, may be a "smart speaker" that uses a voice-activated virtual assistant. The speaker device 100 may connect to the Internet 104 (e.g., through a wireless router) and support a variety of functions, including streaming audio (e.g., music, news, podcasts, sports) and interacting with a virtual assistant to perform tasks (e.g., search the internet, schedule events and alarms, control home automation, control internet-of-things (IoT) devices).

The electronic speaker device 100 includes several elements, including a housing (formed by a front housing member 106 and a rear housing member 108), a passive thermal-control structure 110, and multiple printed circuit boards (PCBs) including at least a main logic board 112 and an audio-power board 114. Additional PCBs that may be used, but which are not illustrated in FIG. 1, may include IC components for light-emitting diode(s) (LEDs), microphone (s), or sensors for detecting input such as touch-input or a button-press. The front housing member 106 (and in some aspects, the rear housing member 108) may be perforated and include openings through which audio waves can travel (e.g., audio waves originating internally from a speaker of the electronic speaker device 100 or originating externally from a user providing voice commands to the electronic speaker device 100). The housing members 106, 108 may include a plastic material and be formed, for example, using plastic injection molding techniques.

The passive thermal-control structure 110 may house multiple speaker modules (e.g., loudspeakers) in a particular orientation, such as a vertically-stacked orientation, relative to a base on which the electronic speaker device rests, with the speaker modules facing horizontally toward a lateral side of the housing (e.g., toward the front housing member 106). In some instances, the passive thermal-control structure 110 may be formed from a metal material to provide both a thermal architecture (e.g., heatsink) and the structural stability (e.g., a structural frame) for the electronic speaker device 100. In an example, the passive thermal-control structure 110 may include a front thermal-structure component 116 and a rear thermal-structure component 118 that are thermally coupled together via a thermal-interface material (TIM) 120, such as a super-high-conductivity gel. Each component of the passive thermal-control structure 110 may have a different relative material, density, thickness, and/or weight. Such differences between the thermal-structure components of the passive thermal-control structure 110 can be used to stabilize the entire assembly of the electronic speaker device 100 by countering or balancing the weight of other components of the electronic speaker device 100, such as the speaker modules, and centering the overall center of gravity of the electronic speaker device 100.

The PCBs (e.g., the main logic board 112, the audio-power board 114) may be formed, for example, from glass-reinforced epoxy material such as FR4. In some instances, the PCBs may include a single layer of electrically conductive traces and be a single-layer board. In other instances, the PCBs may be a multi-layer board that includes multiple layers of electrically conductive traces that are separated by layers of a dielectric material.

Multiple heat-generating, heat-dissipating electronic devices may be mounted to the PCBs and connected to the electrically conductive traces using surface mount and/or through-hole solder techniques. Example heat-generating devices mounted to the PCBs include a SoC IC component, memory IC components, audio amplifiers, and audio inductors. The heat-generating devices may further be mounted onto opposite surfaces of one or more of the PCBs. In aspects, the heat-generating devices may be separated onto different PCBs (e.g., the SoC IC component and the memory IC components may be mounted to the main logic board 112, while the audio amplifier and audio inductors may be mounted to the audio-power board 114, which is separate from the main logic board 112). Separating the audio-power components (e.g., audio amplifier(s) and audio inductor(s)) and the SoC IC component onto different PCBs, such as the audio-power board 114 and the main logic board 112, respectively, may help reduce the temperature of the SoC IC component and other components on the main logic board 112. In some instances, the PCBs may also include an electromagnetic interference (EMI) shield that surrounds heat-generating devices such as the SoC IC component, the audio amplifier, and the audio inductor.

In general, the PCBs (including the multiple heat-generating, electronic devices) may be considered an electronic subassembly of the electronic speaker device 100. While the electronic speaker device 100 is operating, the multiple heat-generating electronic devices may generate heat at a rate (e.g., watts) that, if not dissipated quickly, can damage the electronic speaker device 100.

This damage causing situation, referred to as thermal runaway, can have destructive impacts to the electronic speaker device 100 that include, for example, delamination of the PCBs and/or shortened life of components of the electronic speaker device 100 (e.g., the SoC IC component, the memory components, the audio amplifier, the audio inductors, Wi-Fi components, communication interfaces). In some instances, an operating temperature of the electronic speaker device 100 may exceed a threshold, causing the electronic speaker device 100 to simply shut down (e.g., a thermocouple or other temperature sensing device may provide feedback to a processor or temperature control unit of the electronic speaker device 100 and cause a thermal shut down).

To mitigate instances of thermal runaway, the electronic speaker device 100 includes the passive thermal-control structure 110 (e.g., a thermal-control system absent active components such as a powered fan, a powered pump exchanging fluids, and so on). The passive thermal-control structure 110 may include multiple components (e.g., front and rear thermal-structure components 116, 118), as well as thermal interface materials (e.g., TIM 120), to transfer heat from electronic subsystems of the electronic speaker device 100 to an interior wall of the housing.

Assembly techniques can integrate elements of the passive thermal-control system of the electronic speaker device 100 to maintain a desired form factor and provide a desired thermal performance (e.g., a desired thermal response or temperature profile while the electronic speaker device 100 is operating). Some heat-generating devices within the electronic speaker device 100 may be in "direct" thermal contact with elements of the passive thermal-control system, while other heat-generating devices within the electronic speaker device 100 may be in "indirect" thermal contact with other elements of the passive thermal-control system. In instances of indirect thermal contact, the TIM 120 may be used to reduce air gaps and lessen thermal impedance.

The elements of the passive thermal-control system, through a combination of heat transfer mechanisms internal to the electronic speaker device 100 (e.g., conduction, convection, and radiation) may transfer energy from the heat-generating devices of the electronic speaker device 100 to a shell of the electronic speaker device 100 (e.g., the housing members 106, 108) for dissipation to the ambient environment (e.g., heat "Q" 122 being dissipated using thermal convection). The heat may also be transferred from the heat-generating devices through a base 124 of the electronic speaker device 100, which is connected to the housing members 106, 108 when the electronic speaker device 100 is fully assembled. The base 124 supports the weight of the electronic speaker device 100 when resting on a surface and may be formed of any suitable material, such as a rubber or plastic, having a high friction coefficient to prevent slidable movement on the surface.

In some instances, the passive thermal-control system may prevent thermal runaway as the electronic speaker device 100 operates under a thermal load corresponding to a system power of up to 7 watts (W). In an example, the electronic speaker device 100 may be surrounded by an ambient environment that is approximately 35 degrees Celsius (° C.) and maintain a temperature profile (e.g., temperature profile of electronic subsystems of the electronic speaker device 100) that is less than 65° C.

In other instances, the passive thermal-control system may prevent thermal runaway as the electronic speaker device 100 operates under another thermal load corresponding to a system power of up to 9 W. In an example, the electronic speaker device 100 may be surrounded by an ambient environment that is approximately 35° C. and maintain a temperature profile (e.g., temperature profile of electronic subsystems of the electronic speaker device 100) that is less than 95° C.

Accordingly, the material of the front and rear thermal-structure components 116, 118 of the passive thermal-control structure 110 are selected to provide an efficient thermal performance that maximizes audio performance of the electronic speaker device 100 in ambient conditions up to approximately 35° C. without having to degrade or throttle the performance. The passive thermal-control structure 110 can help to maintain the junction temperature of the silicon of the SoC below a temperature threshold of approximately 80° C. to ensure that the SoC is functioning without degradation in silicon lifecycle and that the leakage power associated with the high temperature is minimized. Additionally, the thermal performance of the passive thermal-control structure 110 is such that the temperature of an exterior surface 126 of the housing members 106, 108 remains below ergonomic limits.

Figure 2:
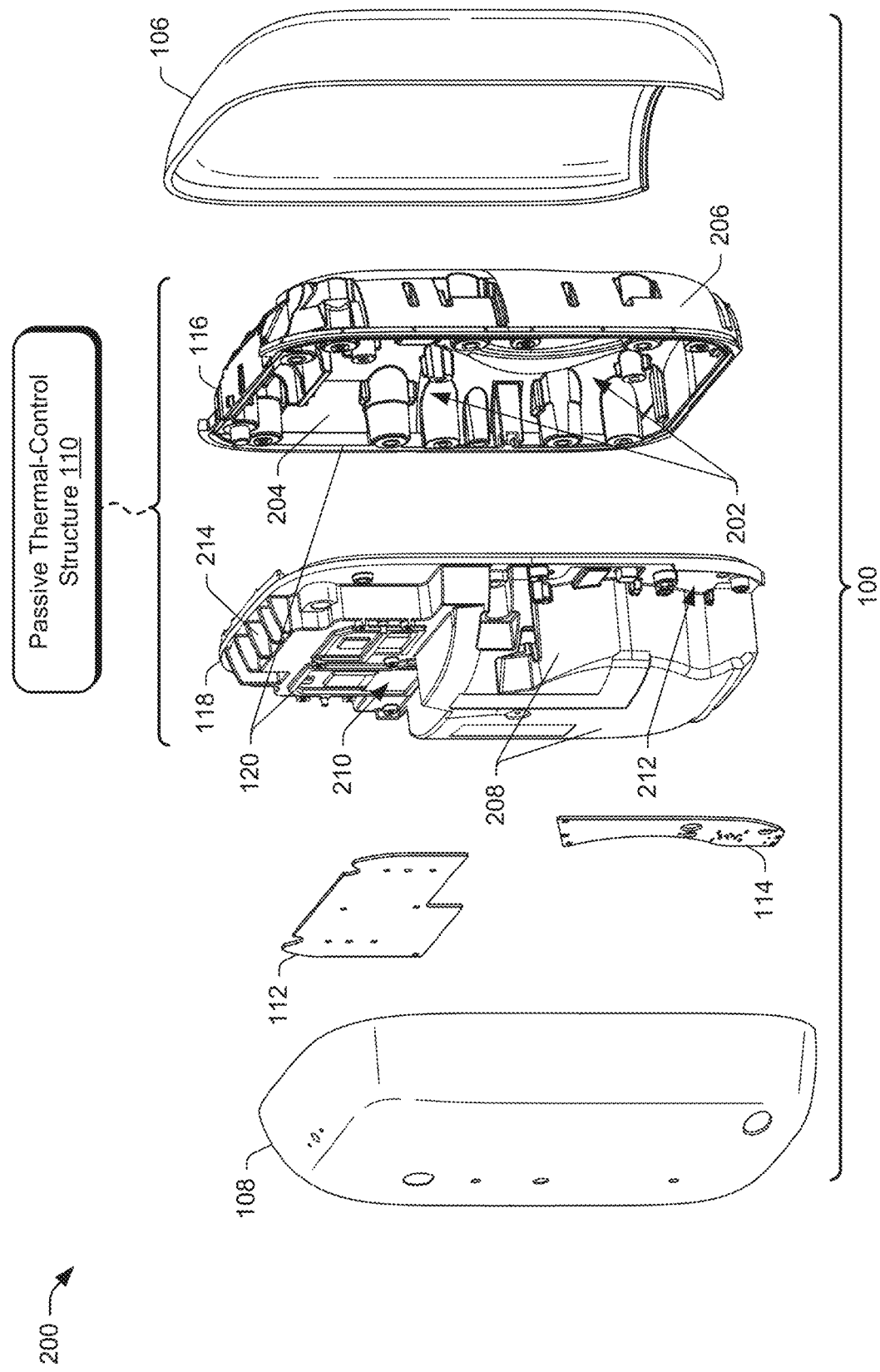
FIG. 2 illustrates an exploded right perspective view of the electronic speaker device from FIG. 1.
Figure 3:
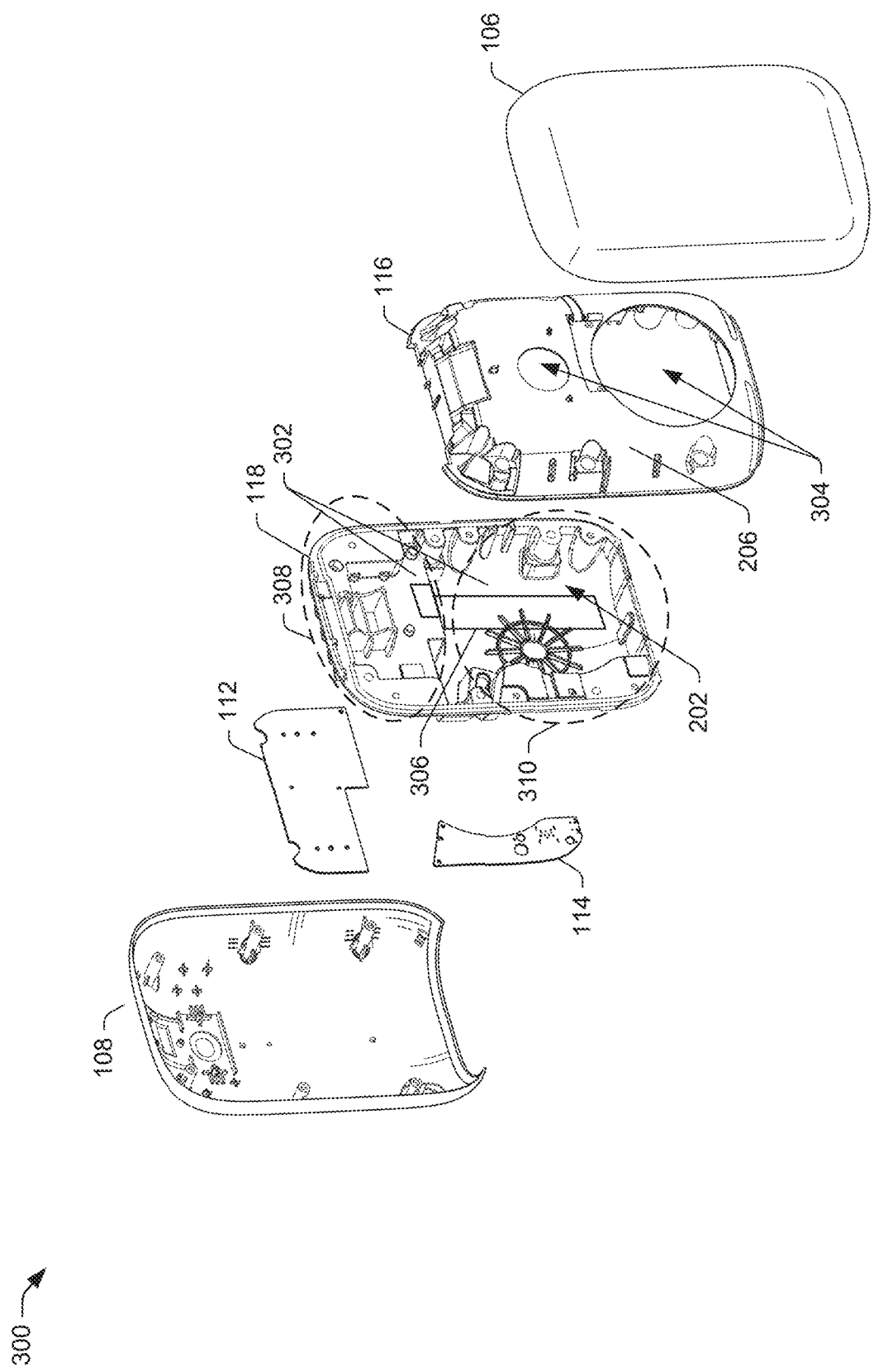
FIG. 3 illustrates an exploded left perspective view of the electronic speaker device from FIG. 1.

FIG. 2 illustrates an exploded right perspective view 200 of the electronic speaker device from FIG. 1. FIG. 3 illustrates an exploded left perspective view 300 of the electronic speaker device from FIG. 1.

The front and rear thermal-structure components 116, 118 of the passive thermal-control structure 110, when coupled together, form a cavity 202 to house the speaker modules in an orientation facing a lateral side of the housing, such as the front housing member 106, in a direction that is substantially parallel to a plane formed by the base 124. The front thermal-structure component 116 of the passive thermal-control structure 110 has an inner surface 204 and an opposing outer surface 206. Similarly, the rear thermal-structure component 118 of the passive thermal-control structure 110 has an outer surface 208 and an inner surface 302 (shown in FIG. 3).

Both the main logic board 112 and the audio-power board 114 are configured to be thermally connected to the outer surface 208 of the rear thermal-structure component 118 of the passive thermal-control structure 110. Additional PCBs can also be thermally connected to the passive thermal-control structure 110, either to the rear thermal-structure component 118 or the front thermal-structure component 116. In one example, all heat-dissipating components can be mounted on the passive thermal-control structure 110. Alternatively, one or more of the heat-dissipating components may be thermally connected to the passive thermal-control structure 110 without being mounted directly to the passive thermal-control structure 110.

The front thermal-structure component 116 and the rear thermal-structure component 118 may each be diecast metals. An example material for the rear thermal-structure component 118 includes a magnesium alloy. An example material for the front thermal-structure component 116 includes an aluminum alloy, which has a higher density than magnesium. In aspects, the front thermal-structure component 116 may have a thickness, between the inner surface 204 and the outer surface 206, that is approximately 4.0 mm thick and the rear thermal-structure component 118 may have a thickness, between the inner surface 302 and the outer surface 208, that is approximately 2.0 mm thick. Accordingly, the first component 116 may have a thickness that is greater than a thickness of the rear thermal-structure component 118. Further, the higher density of the front thermal-structure component 116 (e.g., aluminum) counteracts the weight of the magnet on the speaker module (e.g., woofer) and maintains structural stability for the entire electronic speaker device 100. The lower density of the rear thermal-structure component 118 (e.g., magnesium) prevents additional weight from being added to the back of the electronic speaker device 100, but has a high conductivity to dissipate heat from the audio-power board 114 and the main logic board 112.

Accordingly, the different densities of the front and rear thermal-structure components 116, 118 of the passive thermal-control structure 110 may prevent the electronic speaker device 100 from easily tipping over. Specifically, the passive thermal-control structure 110, based on its density and structure, increases the tipping angle (maximum angle, relative to horizontal, at which an object can lean before tipping over, e.g., when the object's weight force acts through the corner of the object) to an angle that is within a range of approximately 14° to approximately 18°. The passive thermal-control structure 110, based on its density and structure, also increases the amount of tipping force (lateral force near the top of the electronic speaker device 100) that the electronic speaker device 100 can sustain before it tips over, such as a tipping force that is within a range of approximately 1.4 Newtons (N) to approximately 1.6 N. In one example, the passive thermal-control structure 110 may have a tipping angle of approximately 17° and may sustain a tipping force of approximately 1.57 N on a horizontal surface.

The overall shape of the passive thermal-control structure 110 may be dictated by the overall shape and form factor of the electronic speaker device 100. To ensure continuity of the conduction path between the front thermal-structure component 116 and the rear thermal-structure component 118 of the passive thermal-control structure 110, the front thermal-structure component 116 and the rear thermal-structure component 118 can be formed using the same injection molding process. In alternative implementations, the front thermal-structure component 116 and the rear thermal-structure component 118 may each be divided into multiple individual pieces, such as top and bottom pieces. Any suitable number of pieces or sections can be used to construct the passive thermal-control structure 110. However, using a large number of thermal-structure components (e.g., pieces) may be challenging to avoid discontinuity of the conduction path between the various thermal-structure components.

In some aspects, the outer surface 208 of the rear thermal-structure component 118 may have a recessed area to form a substantially planar surface 210 to mount the main logic board 112 and a substantially planar surface 212 to mount the audio-power board 114. The recessed areas on the rear thermal-structure component 118 increase the amount of available surface area of the rear thermal-structure component 118 in comparison to other potential shapes of the rear thermal-structure component 118 (e.g., other shapes of the rear thermal-structure component 118 may not include recessed areas on the outer surface 208), which increases the thermal performance of the rear thermal-structure component 118. Using separate PCBs for the main logic board 112 and the audio-power board increases the thermal performance of the passive thermal-control structure 110 and further spreads the heat generated by the SoC IC component, the audio amplifier(s), and the audio inductor(s). Further, the substantially planar surfaces 210, 212 enable the corresponding PCBs to be mounted to the rear thermal-structure component 118 with a minimum bond-line thickness provided by the TIM 120 to minimize the thermal resistances and provide the best conduction path available into the rear thermal-structure component 118 from the heat-dissipating components, rather than morphing the PCBs into a curved shape.

The TIM 120 is used to minimize the thermal resistance between the PCBs and the passive thermal-control structure 110, as well as between the front and rear thermal-structure components 116, 118 of the passive thermal-control structure 110. Some examples of the TIM 120 include a thermally-conductive gel or grease material, a thermally-conductive foam material, and a thermal pad. In general, the use of the TIM 120 removes air gaps, reduces thermal resistance, and provides a thermal conduction path (i) between the PCBs (or heat-generating components mounted to the PCBs) and the passive thermal-control structure 110 and (ii) between the front and rear thermal-structure components 116, 118 of the passive thermal-control structure 110. In aspects, the TIM 120 may be a super-high-conductivity gel that provides a balance between viscosity and thermal conductivity to minimize the thermal resistance between components with a small thickness (e.g., less than 1.0 mm).

Upon final assembly, a portion of the TIM 120 is (i) disposed between the front and rear thermal-structure components 116, 118 along the edges of each component 116, 118 (e.g., around a frame of the cavity 202) and (ii) in thermal contact with the front thermal-structure component 116 and the rear thermal-structure component 118 of the passive thermal-control structure 110. The TIM 120 may seal the front and rear thermal-structure components 116, 118 together.

In some aspects, different portions of the TIM 120 may be in thermal contact with the PCBs mounted to the passive thermal-control structure 110, such as the main logic board 112, the audio-power board 114, and any other suitable PCB (e.g., light-emitting diode PCB, microphone PCB, user-input control PCB). Portions of the TIM 120 may be in thermal contact with various heat-generating components on the PCBs, such as the SoC on the main logic board 112, an audio amplifier(s) and an audio inductor(s) on the audio-power board 114, or other heat-dissipating components on another PCB or flexible PCB in thermal contact with the passive thermal-control structure 110.

The rear thermal-control structure 118 may also include one or more ribs 214 that are positioned proximate to the planar area 210 and that each define a plane that is substantially perpendicular to the planar area 210. These ribs 214 are configured to provide structural support for the front housing member 106 when fully assembled.

Referring to FIG. 2, the passive thermal-control structure 110 forms the cavity 202 to house the speaker modules in an orientation facing the front housing member 106. The cavity 202 is also shown in FIG. 3, which illustrates one or more apertures 304 in the front thermal-structure component 116 to conform to the speaker drivers of the speaker modules. The cavity 202 may be approximately 80% to approximately 85% of a volume of the electronic speaker device (prior to being filled with the electronic components).

As illustrated in FIG. 3, a heat spreader 306, such as a graphite sheet or heat pipe, can be thermally connected to the inner surface 302 of the rear thermal-structure component 118 of the passive thermal-control structure 110. In particular, the heat spreader 306 can thermally connect an upper area 308 and a lower area 310 of the rear thermal-structure component 118 to increase the isothermalization of the rear thermal-structure component 118, e.g., increase the overall thermal conductivity of the rear thermal-structure component 118. Such a heat spreader may augment the thermal conduction path between different portions of the rear thermal-structure component 118, particularly if the rear thermal-structure component 118 is divided into multiple individual parts. The heat spreader 306 may be positioned to (i) minimize the thermal resistance from the SoC on the main logic board 112 thermally connected to the rear thermal-structure component 118 and (ii) minimize the hot spot on the outer surface 208 of the rear thermal-structure component 118 that is caused by the SoC IC component.

Figure 4:
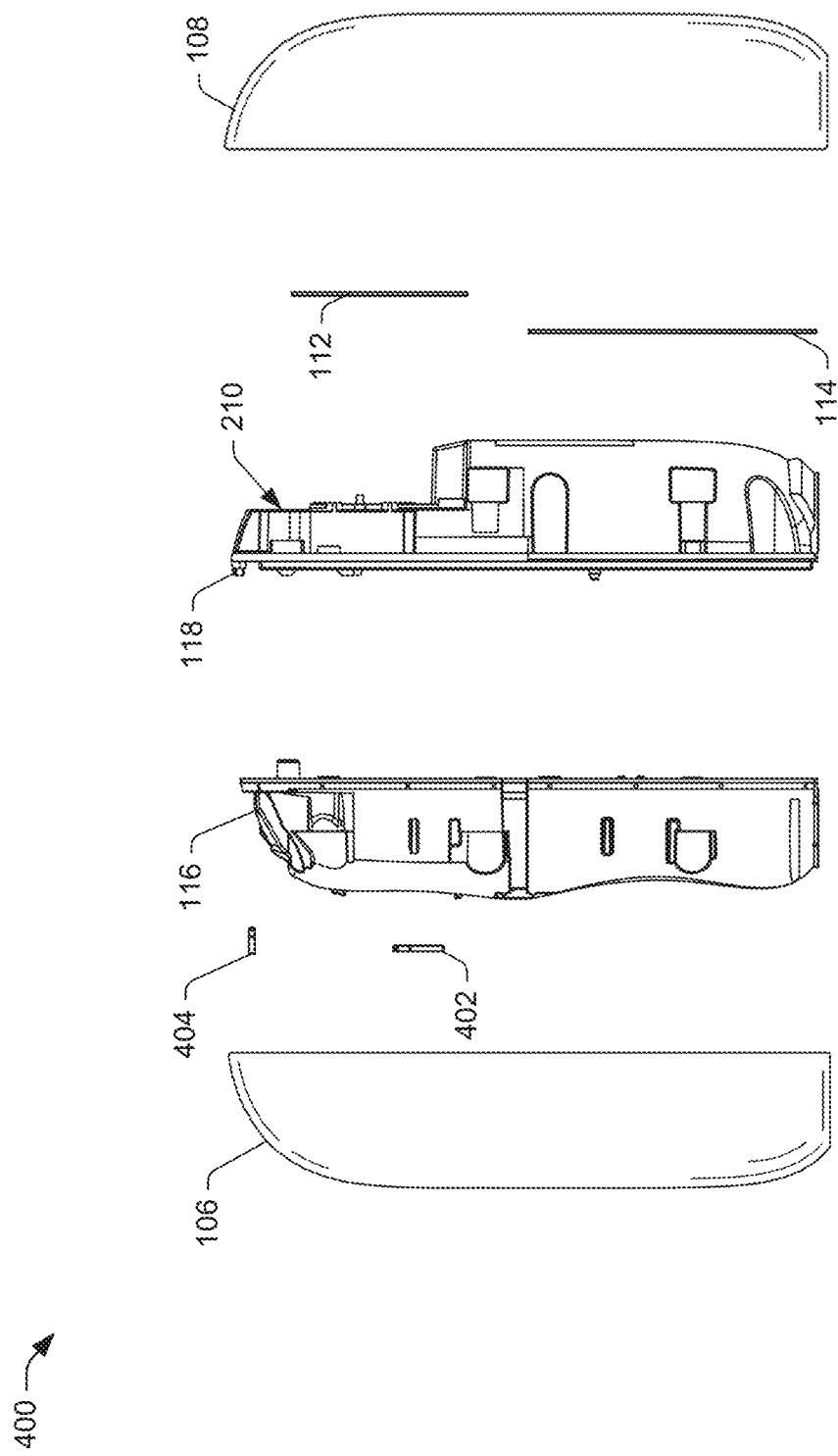
FIG. 4 illustrates an exploded left view of the electronic speaker device from FIG. 1.

FIG. 4 illustrates an exploded left view 400 of the electronic speaker device from FIG. 1. As mentioned, the front housing member 106 and the rear housing member 108 provide a shell for the electronic speaker device 100 while the front thermal-structure component 116 and the rear thermal-structure component 118 of the passive thermal-control structure 110 provide structural stability for the electronic speaker device 100. In addition to thermally coupling the main logic board 112 and the audio-power board 114 to the rear thermal-structure component 118, one or more other PCBs with heat-dissipating components may be thermally coupled to the passive thermal-control structure 110. For example, a PCB 402 with light-emitting diodes (LEDs) may be mounted or otherwise thermally connected to the front thermal-structure component 116 or the rear thermal-structure component 118. In another example, a PCB 404 for controlling sensors, such as touch-input sensors for detecting user input or audio-input sensors for detecting audio input, can be mounted or otherwise thermally connected to the front thermal-structure component 116 or the rear thermal-structure component 118. Accordingly, any suitable PCB, including flexible PCBs, may be thermally connected to either the front thermal-structure component 116 or the rear thermal-structure component 118 of the passive thermal-control structure 110.

Figure 5:
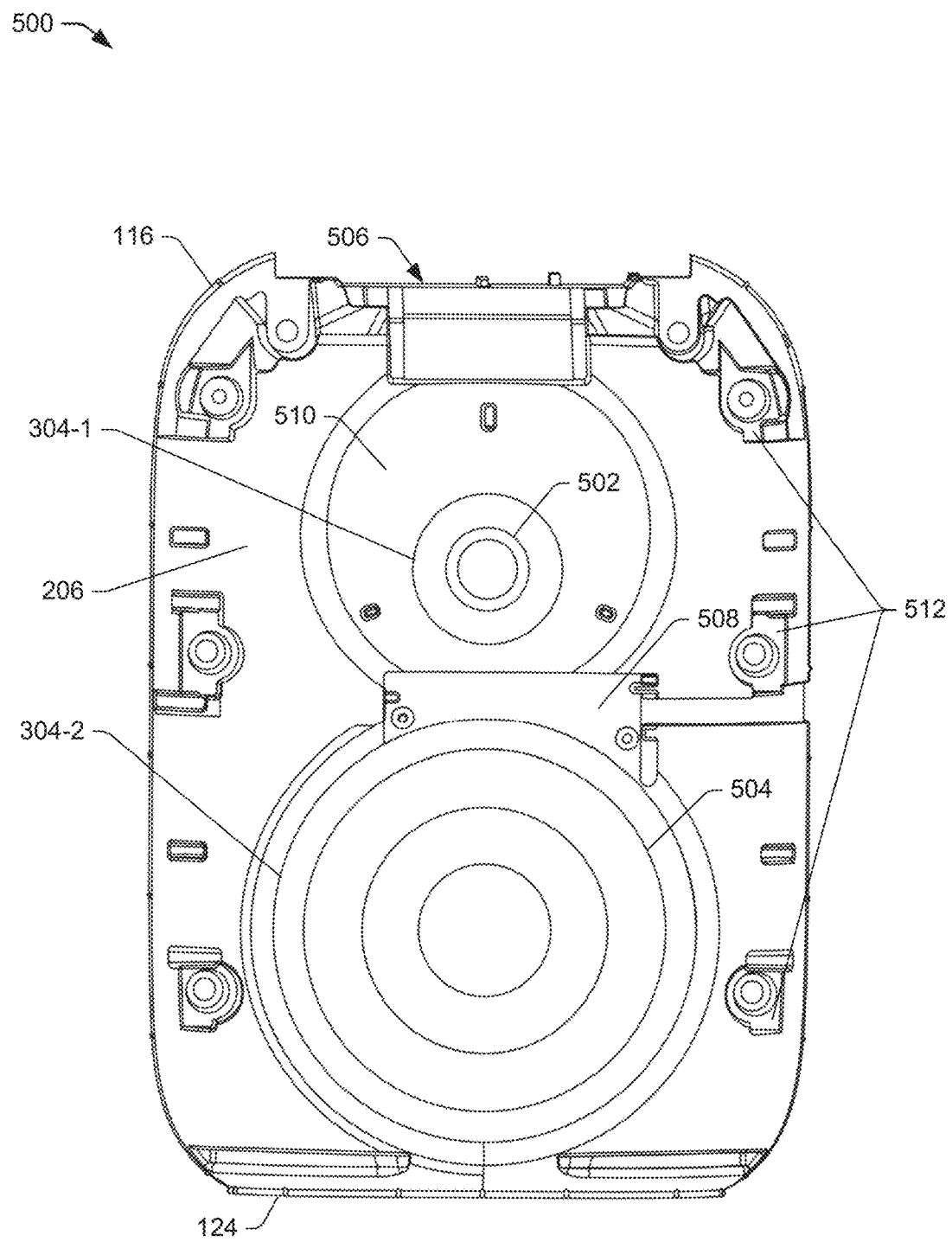
FIG. 5 illustrates a front elevational view of the example passive thermal-control structure from FIG. 1, in accordance with one or more aspects.

FIG. 5 illustrates a front elevational view 500 of the example passive thermal-control structure from FIG. 1, in accordance with one or more aspects. The front thermal-structure component 116 of the passive thermal-control structure 110 includes apertures for the speaker modules, such as the apertures 304 shown in FIG. 3. In the example illustrated in FIG. 5, the front thermal-structure component 116 includes a first aperture 304-1 for a speaker driver 502 of a high-frequency speaker module (e.g., a tweeter) and a second aperture 304-2 for a speaker driver 504 of a low-frequency speaker module (e.g., a woofer). In this way, the passive thermal-control structure 110 enables the heavier, low-frequency speaker module to be positioned proximate to a bottom of the electronic speaker device 100 to lower the overall center of gravity. Additionally, the passive thermal-control structure 110 enables the lighter, high-frequency speaker module to be vertically stacked, relative to the base (e.g., the base 124) on which the electronic speaker device rests, above the lower-frequency speaker module to reduce the size (e.g., diameter) of the base (e.g., the base 124) of the electronic speaker device 100 and maintain a small form factor.

In aspects, the first aperture 304-1 may have a diameter that is approximately 20% to approximately 30% of a width of the passive thermal-control structure 110. Additionally, the second aperture 304-2 may have a diameter that is approximately 60% to approximately 70% of the width of the passive thermal-control structure 110.

The front thermal-structure component 116 may also include one or more substantially planar areas (e.g., planar surface 506 and planar surface 508) configured to receive a PCB with one or more heat-dissipating components, such as the aforementioned PCBs for LEDs, touch-input sensors, or audio-input sensors. In addition, the front thermal-structure component 116 may include an acoustic waveguide 510 for the speaker driver 502 of a high-frequency speaker module to guide audio waves to and from the speaker driver 502. The acoustic waveguide 510 is formed as a recess in the outer surface 206 of the front thermal-structure component 116. The acoustic waveguide 510 may have any suitable size (e.g., outer diameter) and depth, given the available surface area of the front thermal-structure component 116 around the aperture 304-1. In an example, the acoustic waveguide may have an outer diameter 512 that is approximately 45% to approximately 55% of the width of the passive thermal-control structure 110. The depth of the acoustic waveguide 510 may be approximately 2% to approximately 5% of a depth of the passive thermal-control structure 110.

The front thermal-control component 116 also include a plurality of recessed areas 512 that are configured to hold thermoplastic polyurethane (TPU) buckets (not shown), which are each configured to receive a post connected to the inner surface of the front housing member 106 shown in FIG. 1. In aspects, the posts of the front housing member 106 compress fit into the TPU buckets positioned in the recessed areas 512 when the electronic speaker device 100 is fully assembled. In FIG. 5, the front thermal-control component 116 includes six such recessed areas 512. However, any suitable number of such recessed areas can be implemented in the front thermal-control component 116 for securing TPU buckets (or the like) for assembly to the front housing member. Further, the recessed areas 512 may correspond to through holes configured to receive a fastener (e.g., bolt, screw) usable to secure the front thermal-control component 116 to the rear thermal-control component 118 of FIG. 1. However, one or more of the recessed areas 512 may not correspond to, or be aligned with, any such through hole.

Figure 6:
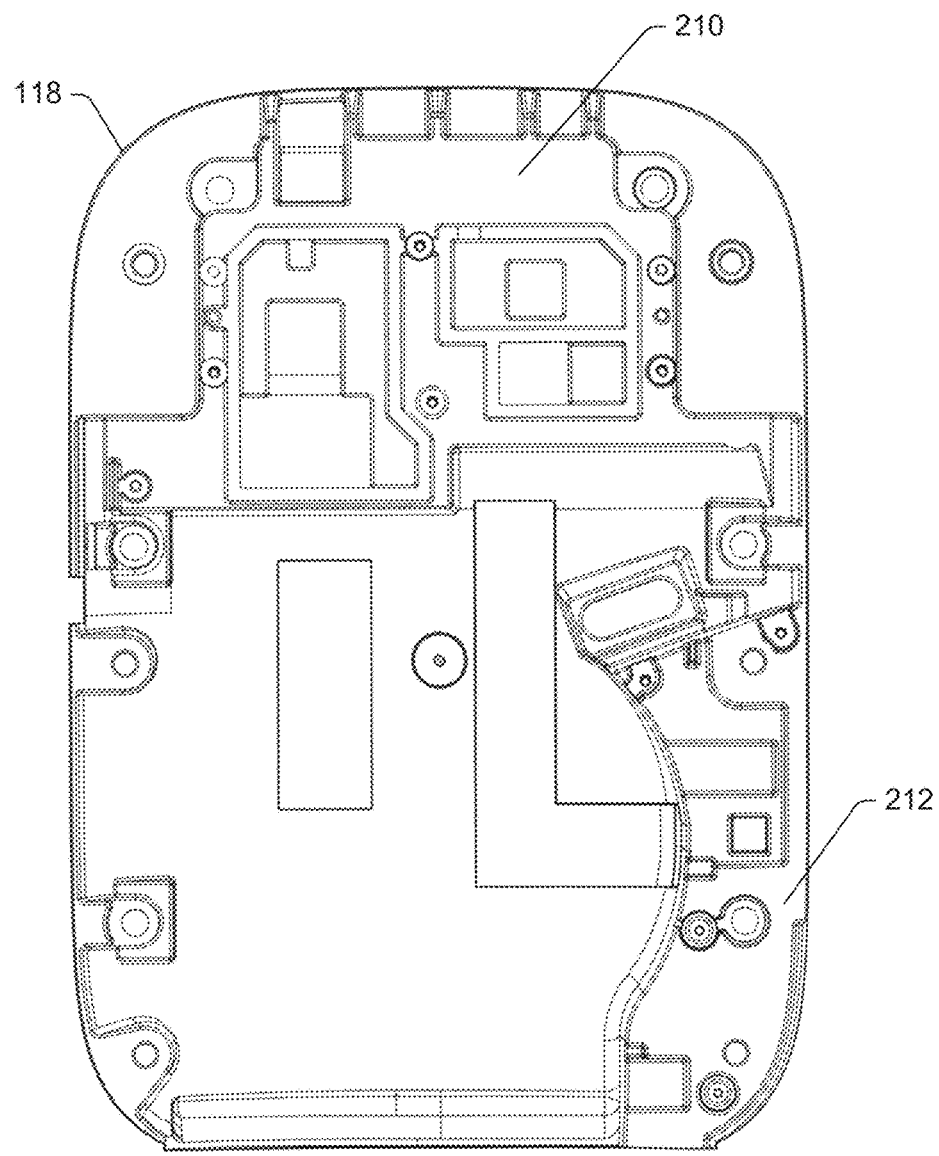
FIG. 6 illustrates a rear elevational view of the example passive thermal-control structure from FIG. 1, in accordance with one or more aspects.

FIG. 6 illustrates a rear elevational view 600 of the example passive thermal-control structure from FIG. 1, in accordance with one or more aspects. In particular, the rear thermal-structure component 118 is illustrated and forms a portion of the structural frame of the electronic speaker device 100 from FIG. 1. As mentioned, the rear thermal-structure component 118 includes the substantially planar surface 210 for mounting a first PCB (e.g., the main logic board 112 from FIG. 1 having the SoC IC component) and the substantially planar surface 212 for mounting a second PCB (e.g., the audio-power board 114 in FIG. 1 having heat-dissipating audio-power components such as the audio amplifier(s) and audio inductor(s)).

Figure 7:
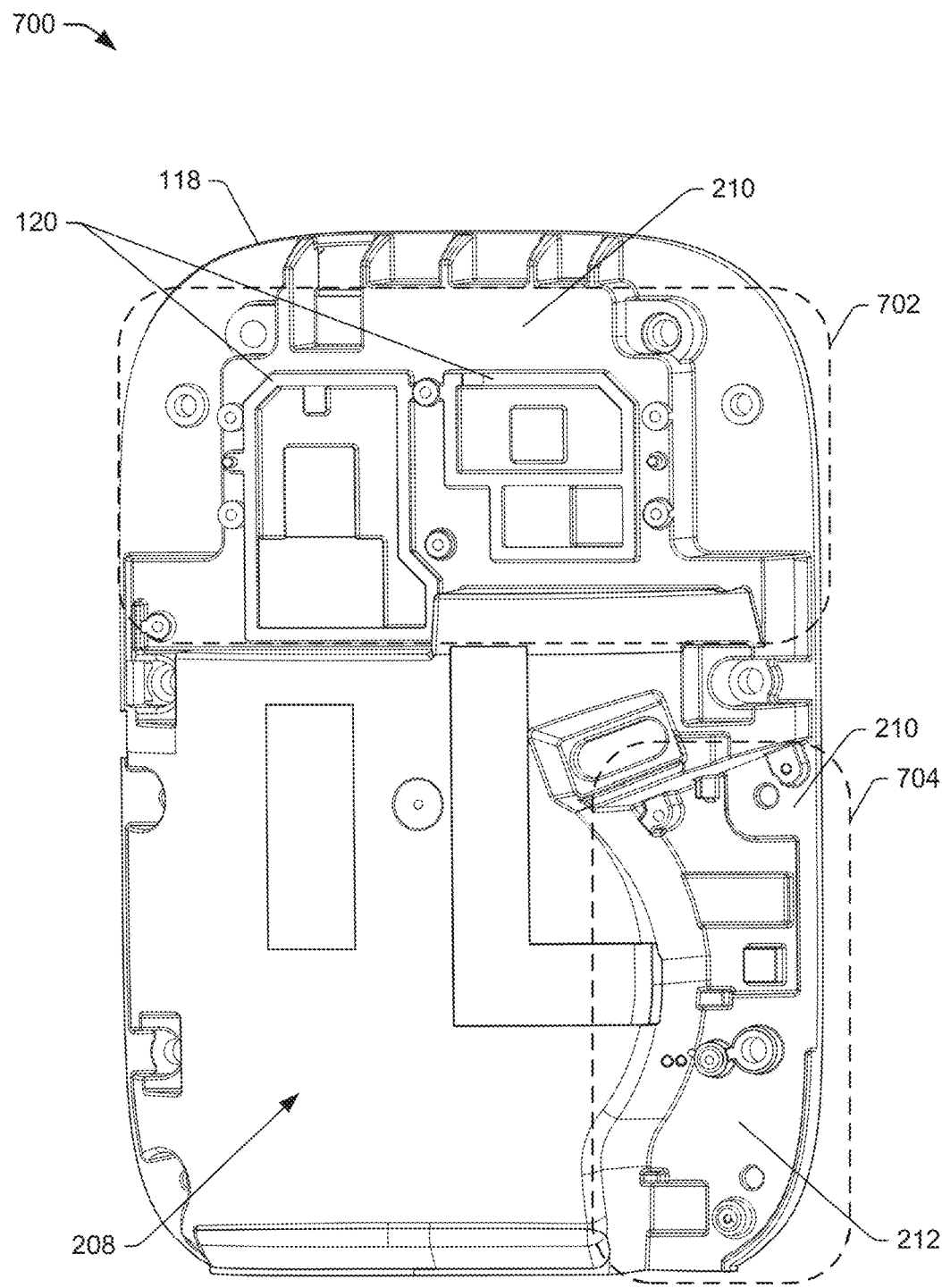
FIG. 7 illustrates a rear perspective view of the example passive thermal-control structure from FIG. 6.

In more detail, consider FIG. 7, which illustrates a rear perspective view 700 of the example passive thermal-control structure from FIG. 6. As above, the rear thermal-structure component 118 may have multiple recessed areas, such as recessed area 702 and recessed area 704, formed in the outer surface 208. For example, the recessed area 702 is formed in the outer surface 208 of the rear thermal-structure component 118 to provide the planar surface 210 for mounting a PCB, such as the main logic board 112 from FIG. 1. In addition, the recessed area 704 is formed in the outer surface 208 of the rear thermal-structure component 118 to form the planar surface 212 for mounting another PCB, such as the audio-power board 114 from FIG. 1. These recessed areas 702, 704 increase the surface area of the rear thermal-structure component 118, which increases the thermal capabilities of the rear thermal-structure component 118. These recessed areas 210, 212 also enable thermally connecting heat-dissipating components (e.g., SoC IC component, audio-power components) with minimized bond-line thicknesses of the TIM 120 to minimize the thermal resistances and provide the best conduction path available into the rear thermal-structure component 118 from the heat-dissipating components.

Through such a combination of the aforementioned elements, the passive thermal-control structure 110 serves as both a structural frame and a heatsink mechanism, for the electronic speaker device 100, to transfer heat (from the IC components mounted to the various PCBs) to the housing members 106, 108 for eventual dissipation external to the electronic speaker device 100 (e.g., dissipation through convection), while maintaining an exterior surface temperature below an ergonomic threshold temperature. The dissipation of the heat can prevent thermal runaway of electronic subsystems of the electronic speaker device 100.

The following paragraphs recite several examples.

Example 1: An electronic speaker device comprising: a housing; a housing; one or more printed circuit boards positioned within the housing and including one or more heat-dissipating components; one or more speaker modules; and a passive thermal-control structure positioned within the housing and thermally coupled to the one or more heat-dissipating components, the passive thermal-control structure comprising at least two thermal-structure components thermally coupled together that: form a structural frame for the electronic speaker device; conduct heat away from the heat-dissipating components; define a cavity to house the one or more speaker modules; and have different densities relative to one another.

Example 2: The electronic speaker device of example 1, further comprising a base connected to the housing and configured to support a weight of the electronic speaker device, wherein: the base has an exterior surface forming a plane; and the at least two thermal-structure components are configured to house the one or more speaker modules in an orientation facing a direction that is substantially parallel to the plane formed by the exterior surface of the base.

Example 3: The electronic speaker device of example 1, wherein the at least two thermal-structure components comprise a first thermal-structure component and a second thermal-structure component, the first thermal-structure component having an aperture for a speaker driver of each of the one or more speaker modules.

Example 4: The electronic speaker device of example 3, wherein the one or more speaker modules comprise multiple speaker modules that are vertically stacked, relative to a base on which the electronic speaker device rests, within the cavity defined by the passive thermal-control structure.

Example 5: The electronic speaker device of example 3, wherein: the first thermal-structure component and the second thermal-structure component are configured to house the one or more speaker modules in an orientation in which a center of gravity of the one or more speaker modules is offset from center; and the first thermal-structure component has a higher density than the second thermal-structure component to balance the center of gravity of the one or more speaker modules that is offset from center.

Example 6: The electronic speaker device of example 3, wherein the first thermal-structure component has a first wall thickness that is greater than a second wall thickness of the second thermal-structure component.

Example 7: The electronic speaker device of example 3, wherein the first and second thermal-structure components are formed from different metal materials relative to one another.

Example 8: The electronic speaker device of example 7, wherein the first thermal-structure component is an aluminum material and the second thermal-structure component is a magnesium material.

Example 9: The electronic speaker device of example 3, wherein the first and second thermal-structure components are diecast metals.

Example 10: The electronic speaker device of example 1, wherein: the one or more printed circuit boards include: a main logic board having a System-on-Chip (SoC); and an audio-power board having one or more audio-power components that dissipate heat; and the main logic board and the audio-power board are mounted to the second thermal-structure component.

Example 11: The electronic speaker device of example 10, wherein: the second thermal-structure component comprises first and second recessed areas formed on an outer surface of the second thermal-structure component; the main logic board is mounted to a substantially planar surface of the first recessed area; and the audio-power board is mounted to another substantially planar surface of the second recessed area.

Example 12: The electronic speaker device of example 1, further comprising a thermal-interface material: thermally connecting the first thermal-structure component to the second thermal-structure component; and thermally connecting the one or more heat-dissipating components to the first thermal-structure component or the second thermal-structure component.

Example 13: The electronic speaker device of example 1, further comprising a heat spreader thermally coupled to an inner surface of the second thermal-structure component, the heat spreader thermally connecting an upper area of the second thermal-structure component to a lower area of the second thermal-structure component.

Example 14: A passive thermal-control structure for an electronic speaker device, the passive thermal-control structure comprising: a first thermal-structure component formed of a first material; and a second thermal-structure component thermally coupled to the first thermal-structure component to form a structural frame for the electronic speaker device, the second thermal-structure component formed of a second material having a different density than the first material, the structural frame: defining a cavity to house multiple speaker modules of the electronic speaker device; and configured to be thermally connected to a plurality of heat-dissipating components of the electronic speaker device.

Example 15: The passive thermal-control structure of example 14, wherein the structural frame is configured to house the multiple speaker modules in a vertically-stacked orientation, relative to a base on which the electronic speaker device rests, with the multiple speaker modules facing a lateral side of the electronic speaker device.

Example 16: The passive thermal-control structure of example 14, wherein the first thermal-structure component includes an aperture for each speaker driver of the multiple speaker modules.

Example 17: The passive thermal-control structure of example 16, wherein the first thermal-structure component is an aluminum material and the second thermal-structure component is a magnesium material.

Example 18: The passive thermal-control structure of example 16, wherein the first thermal-structure component has a higher density than the second thermal-structure component.

Example 19: The passive thermal-control structure of example 14, wherein the second thermal-structure component has an outer surface having multiple recessed areas, each recessed area forming a substantially planar surface for mounting a printed circuit board having one or more of the plurality of heat-dissipating components.

Example 20: The passive thermal-control structure of example 14, further comprising a thermal-interface material that thermally connects the first thermal-structure component to the second thermal-structure component.

What is claimed is:

1. A speaker device comprising:
   a base defining an xy-plane;
   a housing connected to the base such that the housing extends from the base in a z-direction relative to the xy-plane, the housing:
      having a generally rectangular cuboid shape with rounded edges and corners;
      having a height in the z-direction, a width in an x-direction, and a depth in a y-direction, the width being greater than the depth, the height being greater than the width; and
      including a front housing member and a rear housing member that are attached together along an xz-plane, the front housing member including openings that enable passage of audio waves;
   multiple speaker modules disposed within the housing in a stacked orientation in the z-direction, each of the multiple speaker modules oriented to face toward the front housing member; and
   an internal structural housing wherein the multiple speaker modules are housed within the internal structural frame between the front and rear housing members, wherein:
      the internal structural frame includes a front component and a rear component that differ from one another in one or more of material, density, thickness, or weight; and
      the front component includes apertures that conform to speaker drivers of the multiple speaker modules.

2. The speaker device of claim 1, wherein the height of the housing is at least double the depth of the housing.

3. The speaker device of claim 1, wherein the front housing member and the rear housing member include a plastic material and are formed using plastic injection molding.

4. The speaker device of claim 1, wherein the generally rectangular cuboid shape of the housing is generally symmetrical about the xz-plane, about a yz-plane defined at a midpoint of the width, and about another xy-plane defined at a midpoint of the height.

5. The speaker device of claim 1, wherein the openings in the front housing member are perforations.

6. The speaker device of claim 1, wherein the front housing member includes a substantially planar region that includes the openings and is aligned with the multiple speaker modules.

7. The speaker device of claim 1, wherein each of the front and rear housing members is connected to the base along a portion of a perimeter of the base.

8. The speaker device of claim 7, wherein the portion of the perimeter of the base is approximately half of the perimeter.

9. The speaker device of claim 1, wherein the internal structural frame provides structural support for the front and rear housing members.

10. The speaker device of claim 1, wherein the rear component that is thicker than the front component.

11. The speaker device of claim 1, wherein the rear component that is a denser material than the front component.

12. The speaker device of claim 1, wherein the apertures include a first aperture and a second aperture having a greater diameter than the first aperture.

13. The speaker device of claim 12, wherein the multiple speaker modules include:
   a high-frequency speaker module aligned with the first aperture; and
   a low-frequency speaker module aligned with the second aperture.

14. The speaker device of claim 13, wherein:
   the first aperture has a first diameter that is substantially within a range of 20% to 30% of a width of the internal structural frame; and
   the second aperture has a second diameter that is substantially within a range of 60% to 70% of the width of the internal structural frame.

15. A speaker device comprising:
   a base defining an xy-plane;
   a housing connected to the base such that the housing extends from the base in a z-direction relative to the xy-plane, the housing:
      having a generally rectangular cuboid shape with rounded edges and corners;
      having a height in the z-direction, a width in an x-direction, and a depth in a y-direction, the width being greater than the depth, the height being greater than the width; and
      including a front housing member and a rear housing member that are attached together along an xz-plane, the front housing member including openings that enable passage of audio waves;
   multiple speaker modules disposed within the housing in a stacked orientation in the z-direction, each of the multiple speaker modules oriented to face toward the front housing member; and
   an internal structural housing wherein the multiple speaker modules are housed within the internal structural frame between the front and rear housing members and the internal structural frame includes a front component and a rear component that is heavier than the front component.

16. A speaker device comprising:
   a base defining an xy-plane;
   a housing connected to the base such that the housing extends from the base in a z-direction relative to the xy-plane, the housing:
      having a generally rectangular cuboid shape with rounded edges and corners;
      having a height in the z-direction, a width in an x-direction, and a depth in a y-direction, the width being greater than the depth, the height being greater than the width; and
      including a front housing member and a rear housing member that are attached together along an xz-plane, the front housing member including openings that enable passage of audio waves;
   multiple speaker modules disposed within the housing in a stacked orientation in the z-direction, each of the multiple speaker modules oriented to face toward the front housing member;
   an internal structural housing that includes a front component and a rear component that differ from one another in one or more of material, density, thickness, or weight; and multiple printed circuit boards (PCBs) mounted to an exterior surface of the rear component.

17. The speaker device of claim 16, wherein the multiple PCBs include a main logic board and an audio power board.

\* \* \* \* \*